US009437502B1

(12) United States Patent
Cheng et al.

(10) Patent No.: US 9,437,502 B1
(45) Date of Patent: Sep. 6, 2016

(54) METHOD TO FORM STACKED GERMANIUM NANOWIRES AND STACKED III-V NANOWIRES

(71) Applicant: International Business Machines Corporation, Armonk, NY (US)

(72) Inventors: Kangguo Cheng, Schenectady, NY (US); Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/738,316

(22) Filed: Jun. 12, 2015

(51) Int. Cl.
*H01L 21/8238* (2006.01)
*H01L 29/49* (2006.01)
*H01L 29/06* (2006.01)

(52) U.S. Cl.
CPC ................ *H01L 21/823842* (2013.01); *H01L 21/823814* (2013.01); *H01L 21/823864* (2013.01); *H01L 29/0673* (2013.01); *H01L 29/49* (2013.01)

(58) Field of Classification Search
None
See application file for complete search history.

(56) References Cited

U.S. PATENT DOCUMENTS 8,084,308 B2 12/2011 Chang et al.
8,679,902 B1 3/2014 Basker et al.
8,753,942 B2 6/2014 Kuhn et al.
8,765,563 B2 7/2014 Pillarisetty et al.
2008/0135949 A1 6/2008 Lo et al.
2011/0012090 A1 1/2011 Singh et al.
2012/0007052 A1* 1/2012 Hobbs .................... B82Y 10/00 257/24
2012/0187375 A1* 7/2012 Guo ...................... H01L 21/845 257/24
2013/0270512 A1* 10/2013 Radosavljevic H01L 21/823807 257/9
2014/0339611 A1* 11/2014 Leobandung ..... H01L 29/78609 257/288
2014/0353574 A1 12/2014 Li et al.

OTHER PUBLICATIONS

Gu, J.J., et al., "III-V gate-all-around nanowire MOSFET process technology: From 3D to 4D," International Electron Devices Meeting (IEDM), Dec. 2012, pp. 23.7.1-23.7.4.

* cited by examiner

*Primary Examiner* — Charles Garber
*Assistant Examiner* — Steven Christopher
(74) *Attorney, Agent, or Firm* — Scully, Scott, Murphy & Presser, P.C.; Steven J. Meyers

(57) ABSTRACT

A first sacrificial gate structure is formed over a first fin stack and a second sacrificial gate structure is formed over a second fin stack. The first and second fin stacks include alternating layers of a III-V compound semiconductor material portion and a germanium material portion. Source/drain structures are formed adjacent the first and second sacrificial gate structures. The first sacrificial structure is removed to provide a first gate cavity. Exposed III-V compound semiconductor portions in the first gate cavity are removed to suspend a portion of each germanium material portion. A first functional gate structure is formed in the first gate cavity. The second sacrificial structure is removed to provide a second gate cavity. Exposed germanium material portions are removed to suspend a portion of each III-V compound semiconductor material portion of the second fin stack. A second functional gate structure is formed in the second gate cavity.

20 Claims, 7 Drawing Sheets

22L 22R 38 22R 30 30 30 34 14W 26 26 28 28 14W 40 12 10 100 102

METHOD TO FORM STACKED GERMANIUM NANOWIRES AND STACKED III-V NANOWIRES

BACKGROUND

The present application relates to semiconductor manufacturing, and more particularly to a method of forming stacked germanium nanowires and stacked III-V compound semiconductor nanowires on a same substrate.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor nanowire field effect transistors is the next step in the evolution of complementary metal oxide semiconductor (CMOS) devices. Semiconductor nanowires with a partially or a totally surrounding gate is one ideal architecture for off-current reduction in sub-45 nm technologies. A gate-all semiconductor nanowire configuration enables to relax channel film thickness requirements for a target leakage control. Stacked semiconductor nanowires yield very high current levels per layout surface area overcoming the current limit imposed by a small width to pitch ratio.

In such semiconductor nanowire devices, there is a need for providing germanium nanowires for p-channel field effect transistors (pFETs) and III-V compound semiconductor nanowires for n-channel field effect transistors (nFETs) due to the higher mobilites observed in using the different semiconductor channel materials for each type of device.

In view of the above, there is a need to provide a method of forming stacked germanium nanowires and stacked III-V compound semiconductor nanowires on a same substrate.

SUMMARY

In one aspect of the present application, a method of forming a semiconductor structure is provided. The method of the present application includes forming a first sacrificial gate structure straddling over a portion of a first fin stack and a second sacrificial gate structure straddling over a portion of a second fin stack, wherein the first and second fin stacks comprise alternating layers of a III-V compound semiconductor material portion and a germanium material portion. Next, a first source/drain structure is formed on other portions of the first fin stack and adjacent the first sacrificial gate structure and a second source/drain structure is formed on other portions of the second fin stack and adjacent the second sacrificial gate structure.

In one embodiment, the method further includes removing the first sacrificial structure to provide a first gate cavity. Next, each exposed III-V compound semiconductor portion of the first fin stack in the first gate cavity is removed to provide suspended germanium nanowires that comprise a portion of each germanium material portion of the first fin stack. A first functional gate structure is then formed in the first gate cavity and surrounding each suspended germanium nanowire. The second sacrificial structure is then removed to provide a second gate cavity. Each exposed germanium material portion of the second fin stack in the second gate cavity is then removed to provide suspended III-V compound semiconductor nanowires that comprise a portion of each III-V compound semiconductor material portion of the second fin stack. Next, a second functional gate structure is formed in the second gate cavity and surrounding each suspended III-V compound semiconductor nanowire.

In another embodiment, the method described above further includes removing the second sacrificial structure to provide a second gate cavity. Each exposed germanium material portion of the second fin stack in the second gate cavity is then removed to provide suspended IIIV compound semiconductor nanowires that comprise a portion of each III-V compound semiconductor material portion of the second fin stack. Next, a second functional gate structure is formed in the second gate cavity and surrounding each suspended III-V compound semiconductor nanowire. The first sacrificial structure is then removed to provide a first gate cavity. Next, each exposed III-V compound semiconductor portion of the first fin stack in the first gate cavity is removed to provide suspended germanium nanowires that comprise a portion of each germanium material portion of the first fin stack. A first functional gate structure is then formed in the first gate cavity and surrounding each suspended germanium nanowire.

DETAILED DESCRIPTION

Figure 1:
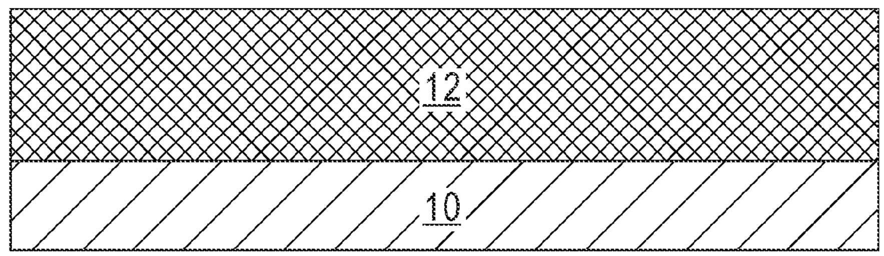
FIG. 1 is a cross sectional view of an exemplary semiconductor structure including a germanium layer located on a surface of a silicon base layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring now to FIG. 1, there is illustrated an exemplary semiconductor structure including a germanium layer 12 located on a surface of a silicon base layer 10 that can be employed in accordance with an embodiment of the present application. In some embodiments (not shown), the silicon base layer 10 can be omitted and a bulk germanium substrate can be used as the germanium layer 12.

The silicon base layer 10 that may be used in the present application is typically single crystalline silicon. In some embodiments of the present application, the silicon base layer 10 that can be used may be a bulk silicon substrate. In other embodiments of the present application, the silicon base layer 10 is an uppermost semiconductor material layer of a semiconductor-on-insulator (SOI) substrate. The SOI substrate would further including an insulator layer, such an oxide and/or nitride, beneath the silicon base layer 10. In some embodiments, a handle substrate may be located beneath the insulator layer. The handle substrate may be any well known semiconductor material such as silicon.

In some embodiments of the present application, the silicon base layer 10 that may be used in the present application is non-doped (i.e., intrinsic silicon). In other embodiments, the silicon base layer 10 may be doped with an n-type or p-type dopant. The term "p-type" refers to the addition of impurities to an intrinsic semiconductor that creates deficiencies of valence electrons. For silicon base layer 10, examples of p-type dopants, i.e., impurities, include, but are not limited to, boron, aluminum, gallium and indium. "N-type" refers to the addition of impurities that contributes free electrons to an intrinsic semiconductor. For silicon base layer 10, examples of n-type dopants, i.e., impurities, include, but are not limited to, antimony, arsenic and phosphorous.

The germanium layer 12 that can be employed in the present application is a relaxed germanium material. The term "relaxed germanium material" is used throughout the present application to denote a germanium material that has a relaxation value of 90% or greater. The thickness of the germanium layer 12 that can be employed in the present application is at or below the critical thickness of a germanium material. Above the critical thickness the germanium material is very defective and is not suitable for use as a device channel material. In one example, the thickness of the germanium layer 12 is from 200 nm to 2000 nm. Other thicknesses that are lesser than, or greater than, the aforementioned thickness range can also be employed in the present application as long as the thickness is below the limit in which defects form and as long as the resultant germanium layer 12 is in a relaxed state.

In some embodiments, the germanium layer 12 can be formed on the silicon base layer 10 utilizing any well known epitaxial growth or epitaxial deposition process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In some embodiments of the present application, the germanium layer 12 has an epitaxial relationship, i.e., same crystal orientation, as that of the exposed surfaces of the silicon base layer 10.

Examples of various epitaxial growth processes that are suitable for use in forming the germanium layer 12 include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE) or metal-organic CVD (MOCVD). The temperature for epitaxial deposition typically ranges from 250° C. to 900° C. Although higher temperature typically results in faster deposition, the faster deposition may result in crystal defects and film cracking. A number of well know germanium source gases may be used for the deposition of the germanium layer 12. Carrier gases like hydrogen, nitrogen, helium and argon can be used.

In yet another embodiment, the exemplary semiconductor structure shown in FIG. 1 can be formed by a wafer bonding process in which a carrier wafer including the germanium layer 12 is bonded to the silicon base layer 10. The carrier wafer is thereafter removed utilizing a well known material removal process including, for example, chemical mechanical polishing and/or grinding.

Figure 2:
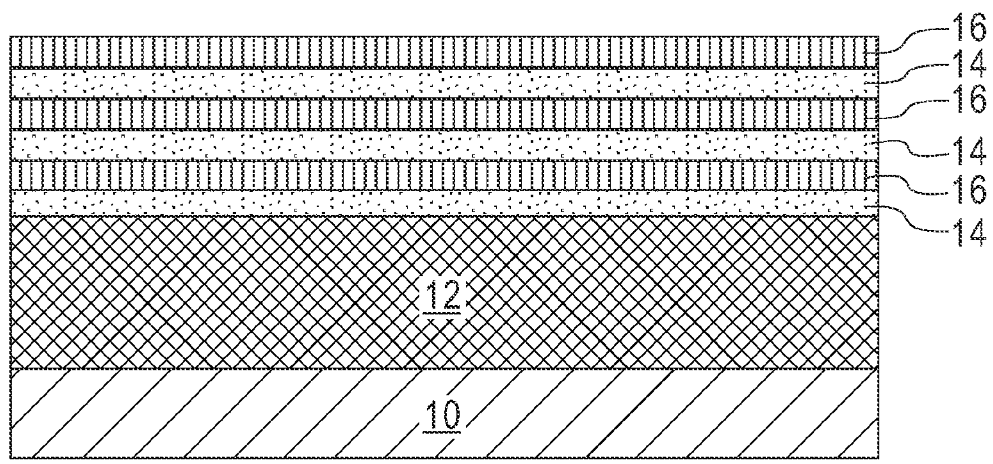
FIG. 2 is a cross sectional view of the exemplary semiconductor structure of FIG. 1 after forming a material stack including alternating layers, and from bottom to top, of a III-V compound semiconductor material and a germanium material.

Referring now to FIG. 2, there is illustrated the exemplary semiconductor structure of FIG. 1 after forming a material stack including alternating layers, and from bottom to top, of a III-V compound semiconductor material 14 and a germanium material 16. The material stack that is formed in the present application includes at least 2n layers that include a III-V compound semiconductor material 14, and at least 2n layers that include a germanium material 16, where n is at least 1; the upper number of n may vary and can be selected to achieve a desired fin height. In one example, three separate layers of the III-V compound semiconductor material 14, and three separate layers of the germanium material 16 as shown in FIG. 2 of the present application can be employed. As is shown in the embodiment of the present application, each layer of the material stack that includes a germanium material 16 is formed on a layer of the material stack that includes a III-V compound semiconductor material 14.

The term "III-V compound semiconductor" as used in conjunction with the III-V compound semiconductor material 14 denotes a semiconductor material that has semiconductor properties and includes at least one element from Group III (i.e., B, Al, Ga, and/or In) of the Periodic Table of Elements and at least one element from Group V (i.e., N, P, As, Sb and/or Bi) of the Periodic Table of Elements. The range of possible formulae is quite broad because the elements can form binary compound semiconductors, tertiary compound semiconductors and even quaternary compound semiconductors. In one embodiment of the present application, InAs, GaAs, or InP can be used as the III-V compound semiconductor material 14 of the material stack illustrated in FIG. 2. In another embodiment of the present application, the III-V compound semiconductor material is lattice matched to germanium (i.e., GaAs). In some embodiments of the present application, each layer of III-V compound semiconductor material 14 within the material stack is a same III-V compound semiconductor. In other embodiments of the present application, at least one layer of III-V compound semiconductor material 14 within the material stack is different from another layer of the III-V compound semiconductor material 14 of the material stack.

Each layer of the III-V compound semiconductor material 14 of the material stack shown in FIG. 2 can be formed utilizing one of the epitaxial growth or deposition processes mentioned above in forming the germanium layer 12. Well known III-V compound semiconductor forming precursors can be used in forming each layer of the III-V compound semiconductor material 14. Each layer of the III-V compound semiconductor material 14 may have a thickness that is in range from 5 nm to 20 nm. Other thicknesses that are lesser than, or greater than, the aforementioned thickness range may also be used for each layer of the III-V compound semiconductor material 14. In some embodiments, each layer of the III-V compound semiconductor material 14 within the material stack has a same thickness. In other embodiments, at least one layer of the III-V compound semiconductor material 14 within the material stack has a different thickness than another layer of the III-V compound semiconductor material 14 of the material stack.

Each layer of the germanium material 16 of the material stack shown in FIG. 2 can be formed utilizing one of the epitaxial growth or deposition processes mentioned above in forming the germanium layer 12. Well known germanium source gases can be used in forming each layer of the germanium material 16. Each layer of the germanium material 16 may have a thickness that is in range from 5 nm to 20 nm. Other thicknesses that are lesser than, or greater than, the aforementioned thickness range may also be used for each layer of germanium material 16. In some embodiments, each layer of the germanium material 16 within the material stack has a same thickness. In other embodiments, at least one layer of the germanium material 16 within the material stack has a different thickness than another layer of the germanium material 16 of the material stack.

Figure 3:
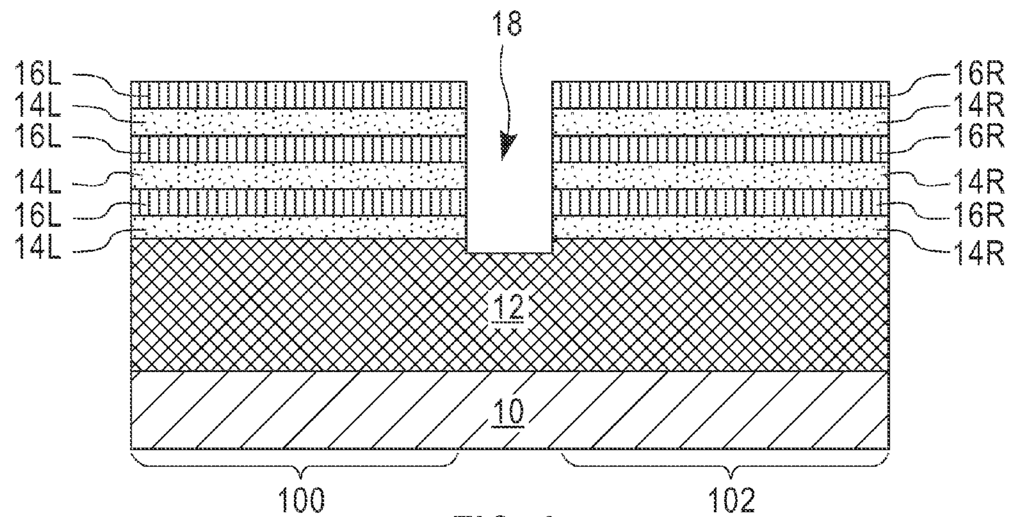
FIG. 3 is a cross sectional view of the exemplary semiconductor structure of FIG. 2 after forming a first fin stack within a first device region and a second fin stack in a second device region, wherein the first and second fin stacks comprise alternating layers, and from bottom to top, of a III-V compound semiconductor material portion and a germanium material portion.

Referring now to FIG. 3, there is illustrated the exemplary semiconductor structure of FIG. 2 after forming a first fin stack within a first device region 100 and a second fin stack in a second device region 102. In the present application, the first device region 100 may also be referred to as an nFET device region since nFET devices will be subsequently formed therein, while the second device region 102 may also be referred to as a pFET device region since pFET devices will be subsequently formed therein.

The first fin stack (14L, 16L) comprises alternating layers, and from bottom to top, of a III-V compound semiconductor material portion 14L and a germanium material portion 16L. The second fin stack (14R, 16R) comprises alternating layers, and from bottom to top, of a III-V compound semiconductor material portion 14R and a germanium material portion 16R. Each III-V compound semiconductor portion 14L, 14R represents a remaining portion of each layer of the III-V compound semiconductor material 14 described above in FIG. 2. Each germanium material portion 16L, 16R represents a remaining portion of each layer of the germanium material 16 described above in FIG. 2. Element 18 represents a gap that separates the first fin stack (14L, 16L) from the second fin stack (14R, 16R). As is shown, gap 18 extends beneath the topmost surface of the germanium layer 12.

Although the present application describes and illustrates the formation of a single first fin stack (14L, 16L) and a single second fin stack (14R, 16R), a plurality of first fin stacks (14L, 16L) and/or a plurality of second fin stacks (14R, 16R) can be formed. Each first fin stack (14L, 16L) and each second fin stack (14R, 16R) extends upward from a topmost surface of different portions of the germanium layer 12.

Each first fin stack (14L, 16L) and each second fin stack (14R, 16R) can be formed by patterning the material stack including alternating layers, and from bottom to top, of the III-V compound semiconductor material 14 and the germanium material 16 shown in FIG. 2.

In one embodiment of the present application, the patterning process comprises a sidewall image transfer (SIT) process. The SIT process includes forming a contiguous mandrel material layer (not shown) over the topmost layer of the germanium material 16 of the material stack provided in FIG. 2. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers entirely through the material stack including alternating layers, and from bottom to top, of the III-V compound semiconductor material 14 and the germanium material 16 provided in FIG. 2 and partially into germanium layer 12. In some embodiments, the pattern transfer may stop on the topmost surface of germanium layer 12. The pattern transfer may be achieved by utilizing at least one etching process. Examples of etching processes that can used to transfer the pattern may include dry etching (i.e., reactive ion etching, plasma etching, ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

In another embodiment, the patterning process can include lithography and etching. Lithography includes forming a photoresist material (not shown) over the topmost layer of the germanium material 16 of the material stack provided in FIG. 2. The photoresist material can be formed utilizing a deposition process such as, for example, spin-on coating, evaporation, or chemical vapor deposition. Following the deposition of the photoresist material, the photoresist material is exposed to a pattern of irradiation, and thereafter the exposed resist material is developed utilizing a conventional resist developer to provide a patterned photoresist material. At least one etch as mentioned above for the SIT process can be used here to complete the pattern transfer. Following at least one pattern transfer etch process, the patterned photoresist material can be removed from the structure utilizing a conventional resist stripping process such as, for example, ashing.

In any of the patterning processes mentioned above, a hard mask layer such as, for example, silicon dioxide and/or silicon nitride, may be formed on the topmost layer of the germanium material 16 of the material stack provided in FIG. 2 prior to patterning. After patterning, a remaining portion of the hard mask layer is present atop each topmost germanium material portion of the first and second fin stacks. The portion of the hard mask layer that remains after patterning can be referred to herein as hard mask cap (not shown). The hard mask cap can be removed after patterning by a planarization process such as, for example, chemical mechanical planarization and/or grinding.

Each first fin stack (14L, 16L) and each second fin stack (14R, 16R) that is formed includes a pair of vertical sidewalls that are parallel to each other. As used herein, a surface is “vertical” if there exists a vertical plane from which the surface does not deviate by more than three times the root mean square roughness of the surface. In one embodiment of the present application, each first fin stack (14L, 16L) and each second fin stack (14R, 16R) that is formed has a height from 10 nm to 100 nm (the upper height limit is determined by the total number of layers within the material stack provided in FIG. 2), and a width from 5 nm to 30 nm. Other heights and widths that are lesser than, or greater than, the aforementioned ranges may also be used in the present application for each first fin stack (14L, 16L) and each second fin stack (14R, 16R). Each first fin stack (14L, 16L) and each second fin stack (14R, 16R) has a same height and a same width.

When multiple first fin stacks (14L, 16L) are formed, each first fin stack (14L, 16L) is orientated parallel to each other. When multiple second fin stacks (14R, 16R) are formed, each second fin stack (14R, 16R) is orientated parallel to each other. In the drawings, the multiple first fin stacks would be orientated in front and in back of the first fin stack illustrated in FIG. 3, and the multiple second fin stacks would be orientated in front and in back of the second fin stack illustrated in FIG. 3. Each first and/or second fin stack is separated from its nearest neighboring first and/or second fin stack by a pitch that is from 20 nm to 60 nm; the pitch can be measured from a central portion of one first or second fin stack to a central portion of the nearest neighboring first or second fin stack.

Figure 4A:
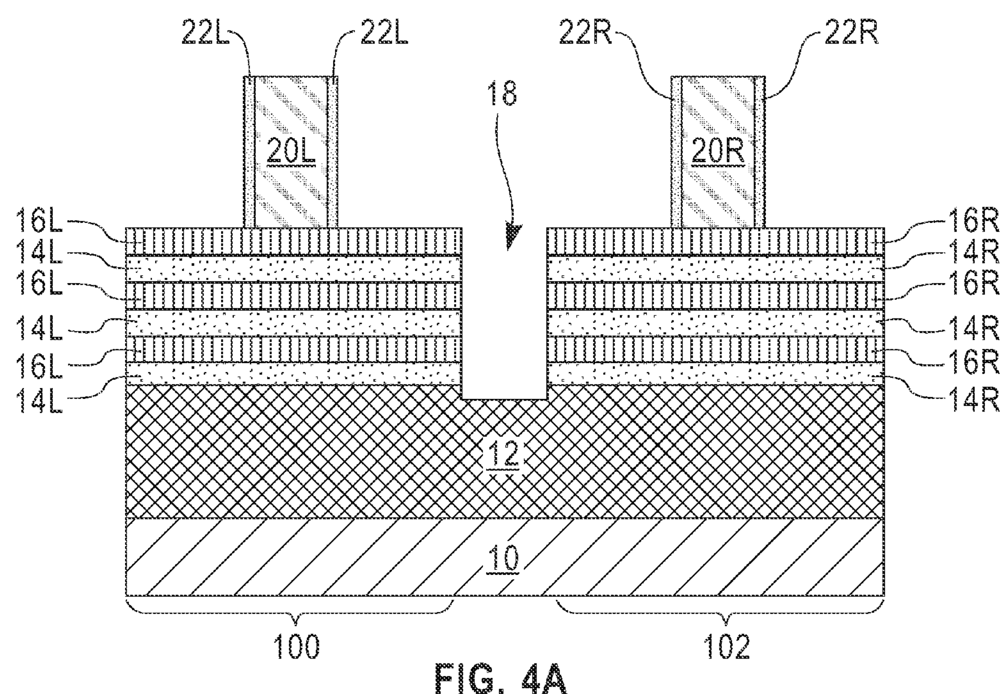
FIG. 4A is a cross sectional view along the fin direction of the exemplary semiconductor structure of FIG. 3 after forming a first sacrificial gate structure and a first dielectric spacer straddling over a portion of the first fin stack and a second sacrificial gate structure and a second dielectric spacer straddling over a portion of the second fin stack.
Figure 4B:
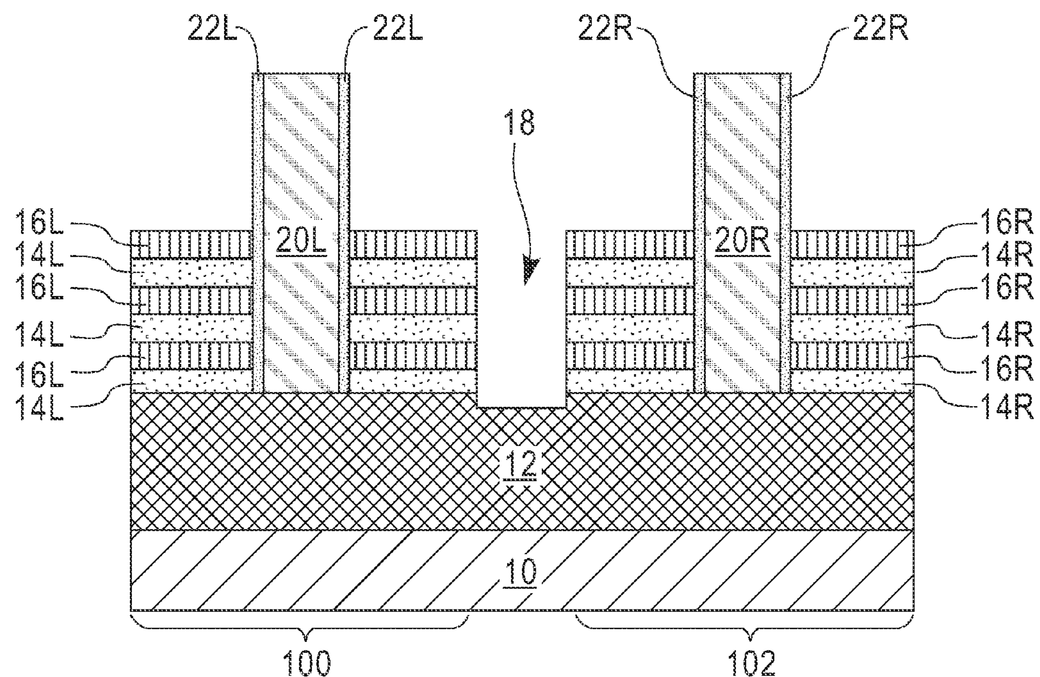
FIG. 4B is a cross sectional view in between the fins of the exemplary semiconductor structure of FIG. 3 after forming a first sacrificial gate structure and a first dielectric spacer straddling over a portion of the first fin stack and a second sacrificial gate structure and a second dielectric spaces straddling over a portion of the second fin stack.

Referring now to FIGS. 4A-4B, there are illustrated various views of the exemplary semiconductor structure of FIG. 3 after forming a first sacrificial gate structure 20L and a first dielectric spacer 22L straddling over a portion of the first fin stack (14L, 16L) and a second sacrificial gate structure 20R and a second dielectric spacer 22R straddling over a portion of the second fin stack (14R, 16R). As is shown, each of the first and second sacrificial gate structures (20L, 20R) has a topmost surface that is coplanar with a topmost surface of the first and second dielectric spacers (22L, 22R). The first second sacrificial gate structure 20L is located over a gate region within the first device region 100, while the second sacrificial gate structure 20R is located over a gate region within the second device region 102.

By “sacrificial gate structure” it is meant a material or material stack that serves as a placeholder for a subsequently formed functional gate structure. In such a process, the functional gate structure is formed after the source/drain structures have been formed. Although a single first sacrificial gate structure 20L and a single second sacrificial gate structure 20R are described and illustrated, a plurality of first sacrificial gate structures and/or a plurality of second sacrificial gate structures can be formed over different portions of each first fin stack (14L, 16L) and each second fin stack (14R, 16R).

The first sacrificial gate structure 20L and the second sacrificial gate structure 20R may each include a single sacrificial material or a stack of two or more sacrificial materials (i.e., at least one sacrificial material portion). In one embodiment, the at least one sacrificial material portion comprises, from bottom to top, a sacrificial gate dielectric portion, a sacrificial gate portion and a sacrificial dielectric cap portion. In some embodiments, the sacrificial gate dielectric portion and/or the sacrificial dielectric cap portion can be omitted and only a sacrificial gate portion is formed. The at least one sacrificial material portion can be formed by forming a blanket layer (or layers) of a material (or various materials) and then patterning the material (or various materials) by lithography and an etch. In one embodiment, the at least one sacrificial material portion can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than silicon dioxide. In some embodiments, a multilayered dielectric structure comprising different dielectric materials, e.g., silicon dioxide, and a high k dielectric can be formed and used as the sacrificial gate portion. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition. In some embodiments, a thermal process including, for example, thermal oxidation, may be used.

After forming the blanket layer of sacrificial gate dielectric material, a blanket layer of a sacrificial gate material can be formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material, a blanket layer of a sacrificial gate cap material is formed. The sacrificial gate cap material may include one of the materials mentioned above for the hard mask layer that was mentioned above. The sacrificial gate cap material can be formed utilizing one of the deposition techniques mentioned above for forming sacrificial gate dielectric material.

After providing the above mentioned sacrificial material stack (or any subset of said sacrificial materials), lithography and etching can be used to pattern the sacrificial material stack (or any subset of said sacrificial materials) and to provide the first and sacrificial gate structures 20L, 20R. The remaining portions of the sacrificial gate dielectric material constitute a sacrificial gate dielectric portion, the remaining portions of the sacrificial gate material constitute a sacrificial gate portion, and the remaining portions of the sacrificial dielectric cap material constitute a sacrificial dielectric cap portion.

After forming the first and second sacrificial gate structures (20L, 20R), a first dielectric spacer 22L is formed on all exposed sidewall surfaces of the first sacrificial gate structure 20L, and a second dielectric spacer 22R is formed on all exposed sidewall surfaces of the second sacrificial gate structure 20R. As shown in FIG. 4B, the first dielectric spacer 22L straddles over another portion of each first fin stack (14L, 16L), while the second dielectric spacer 22R straddles over another portion of each second fin stack (14R, 16R).

The first and second dielectric spacers (22L, 22R) can be formed by first providing a dielectric spacer material and then etching the dielectric spacer material. Examples of dielectric spacer materials that may be employed in the present application include dielectric oxides, dielectric nitrides and/or dielectric oxynitrides. In one embodiment, the dielectric spacer material used in providing the first and second dielectric spacers (22L, 22R) is composed silicon nitride. The dielectric spacer material may be provided by a deposition process including, for example, chemical vapor deposition (CVD), plasma enhanced chemical vapor deposition (PECVD), or physical vapor deposition (PVP). The etch used to provide the first and second dielectric spacers (22L, 22R) may comprise a dry etching process such as, for example, reactive ion etching.

Figure 5A:
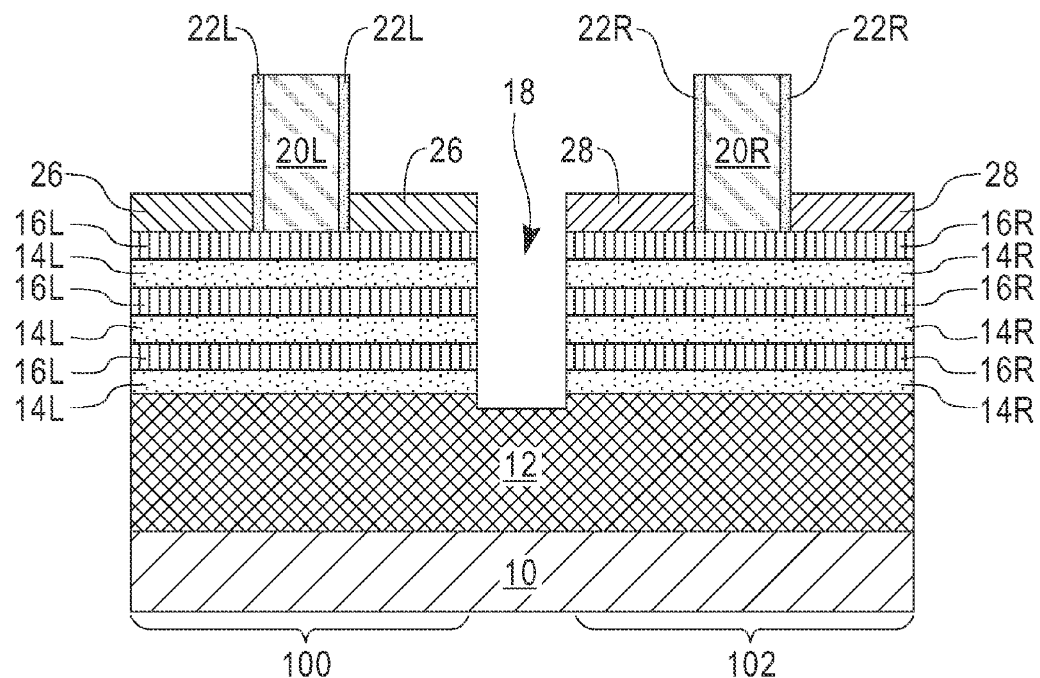
FIG. 5A is a cross sectional view along the fin direction of the exemplary semiconductor structure of FIG. 4A after forming, in any order, a first source/drain structure in the first device region and a second source/drain structure in the second device region.
Figure 5B:
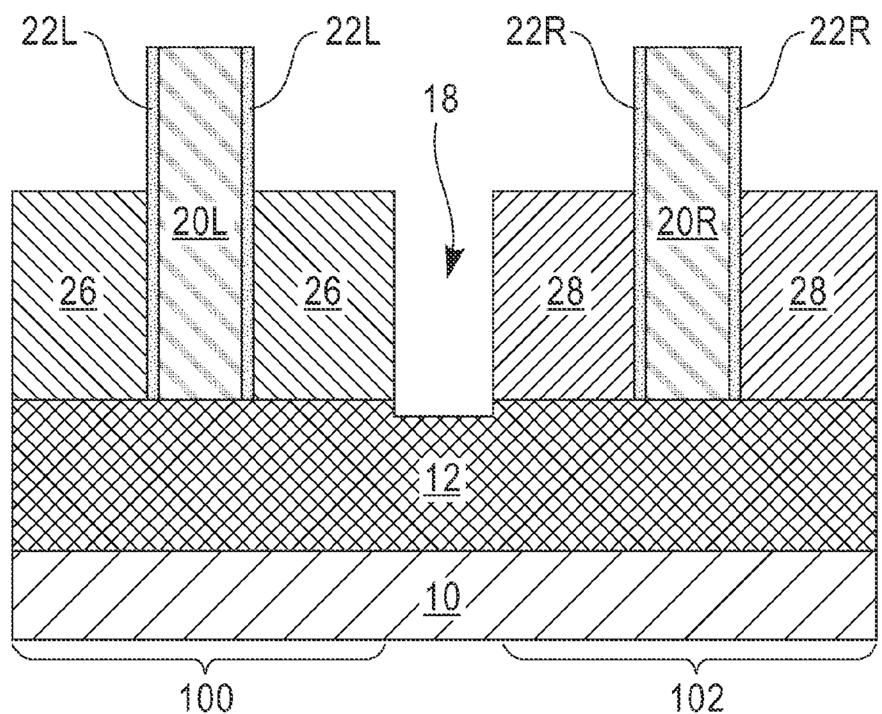
FIG. 5B is a cross sectional view in between the fins of the exemplary semiconductor structure of FIG. 4B after forming, in any order, a first source/drain structure in the first device region and a second source/drain structure in the second device region.

Referring now to FIGS. 5A-5B, there are illustrated various views of the exemplary semiconductor structure of FIGS. 4A-4B after forming, in any order, a first source/drain structure 26 in the first device region 100 and a second source/drain structure 28 in the second device 102. As shown in FIG. 5A, the first source/drain structure 26 is formed over remaining portions of the first fin stack that lie adjacent to the first structure gate structure 20L, while the second source/drain structure 28 is formed over remaining portions of the second fin stack that lie adjacent to the second structure gate structure 20R. In the view shown in FIG. 5B, the first source/drain structure 26 is formed on sidewall surfaces of each remaining portion of the first fin stack that lie adjacent to the first structure gate structure 20L, while the second source/drain structure 28 is formed on sidewall surfaces of each remaining portion of the second fin stack that lie adjacent to the second structure gate structure 20R.

As is shown, the first source/drain structure 26 is formed at the footprint of the first sacrificial gate structure 20L. The first source/drain structures 26 that is formed on one side of the first sacrificial gate structure 20L provides a source structure within the first device region 100, while the first source/drain structure 26 that is formed on the other side of the first sacrificial gate structure 20L forms a drain structure within the first device region 100. As is shown, the second source/drain structure 28 is formed at the footprint of the second sacrificial gate structure 20R. The second source/drain structure 28 that is formed on one side of the second gate sacrificial gate structure 20R provides a source structure within the second device region 102, while the second source/drain structure 28 that is formed on the other side of the second sacrificial gate structure 20R forms a drain structure within the second device region 102. In some embodiments, and when a plurality of first sacrificial gate structures are present, a plurality of unmerged first source/drain structures 26 on each side of each first sacrificial gate structure 20L may form. In other embodiments, and when a plurality of first sacrificial gate structures are present, each individual first source/drain structure 26 on each side of each first sacrificial gate structure 20L may be merged. The second source/drain structure 28 may likewise be merged or unmerged.

The first and second source/drain structures (26, 28) may comprise any semiconductor material that includes an n-type or a p-type dopant. The semiconductor material that provides the first and second source/drain structures (26, 28) may include, for example, Si, Ge, SiGe, SiC, SiGeC, a II/VI compound semiconductor or a III/V compound semiconductor such as, for example, InAs, GaAs, or InP. The semiconductor material that provides the first and second source/drain structures (26, 28) can be formed utilizing an epitaxial deposition process as mentioned above. In some embodiments, a block mask is formed over one of the device regions, and thereafter one of the source/drain structures is epitaxially deposited in the device region not including the block mask. After the epitaxial growth, the block mask is removed, another block mask is then formed over the device region in which the source/drain structure was previously epitaxially grown, and thereafter the other source/drain structure is formed in the device region not including the another block mask. The another block mask is then removed after epitaxially deposition of the other source/drain structure. The dopant can be introduced into the semiconductor material that provides the first and second source/drain structures (26, 28) during the growth of the semiconductor material, or after growth of an intrinsic semiconductor utilizing gas phase doping.

Figure 6:
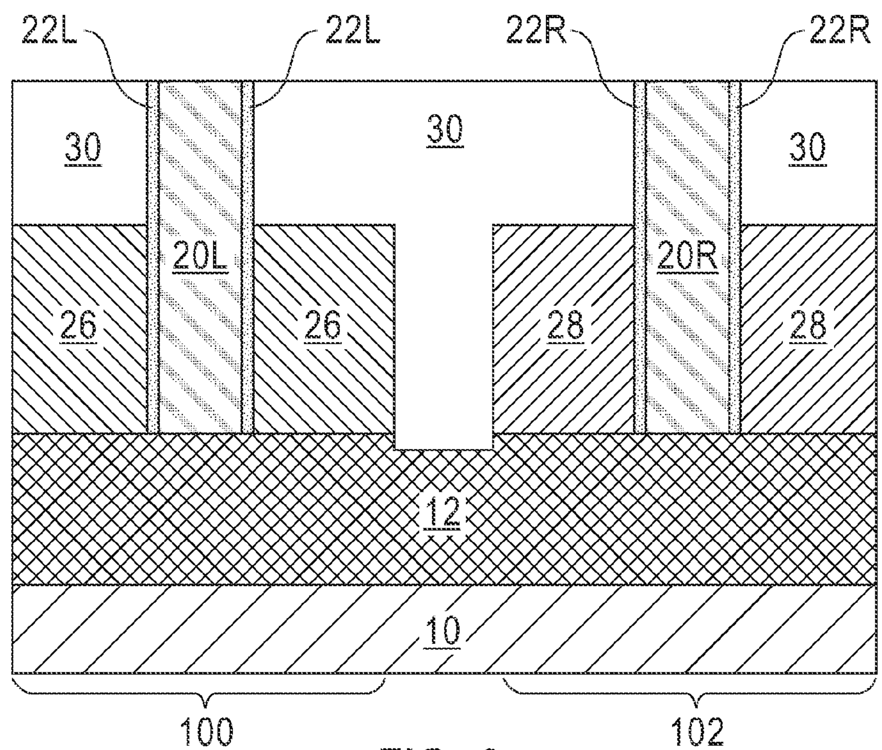
FIG. 6 is a cross sectional view in between the fins of the exemplary semiconductor structure of FIG. 5B after forming an interlevel dielectric (ILD) material.

Referring now to FIG. 6, there is illustrated the exemplary semiconductor structure of FIG. 5B after forming an interlevel dielectric (ILD) material 30. As is shown, the ILD material 30 fills in gap 18 and is located atop each first source/drain structure 26 and each second source/drain structure 28. The ILD material 30 is also laterally adjacent the first and second sacrificial gate structures (20L, 20R) and has a topmost surface that is coplanar with a topmost surface of each of the first and second sacrificial gate structures (20L, 20R) as well as with a topmost surface of the first and second dielectric spacers (22L, 22R).

In some embodiments, the ILD material 30 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the ILD material 30. The use of a self-planarizing dielectric material as ILD material 30 may avoid the need to perform a subsequent planarizing step.

In one embodiment, the ILD material 30 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the ILD material 30, a planarization process or an etch back process follows the deposition of the ILD material 30. The thickness of the ILD material 30 that can be employed in the present application may vary depending on the type of dielectric material employed as well as the method that was employed in forming the same. In one embodiment, the ILD material 30 has a thickness from 80 nm to 500 nm. Other thicknesses that are greater or lesser than the range provided above can also be used for the ILD material 30.

Figure 7:
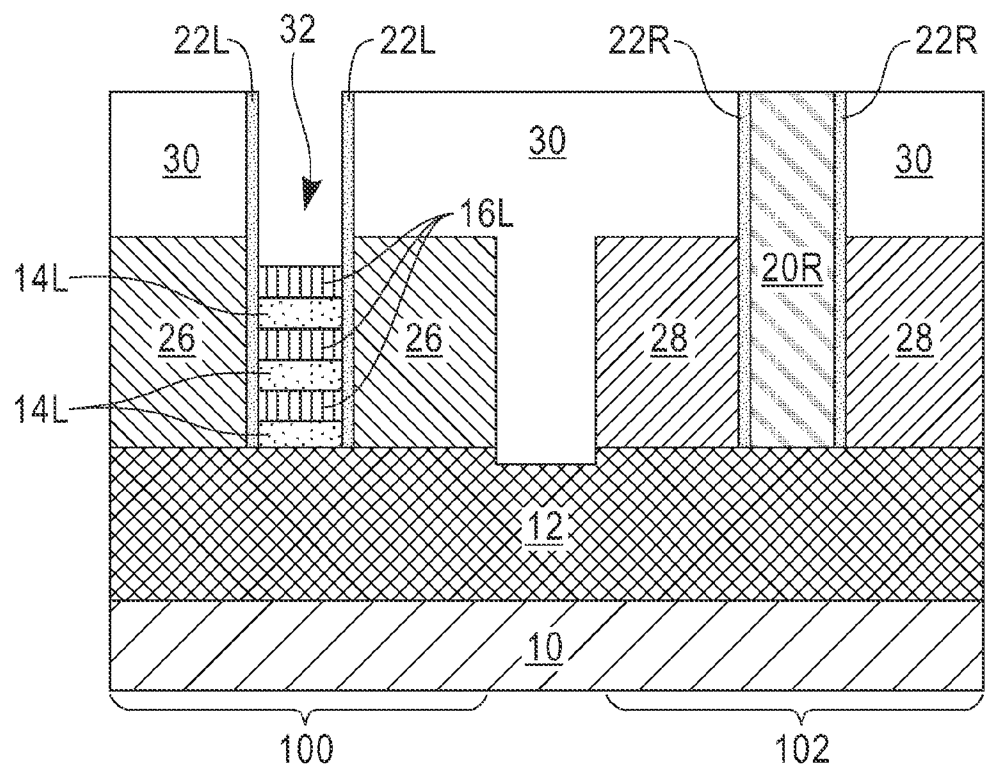
FIG. 7 is a cross sectional view in between the fins of the exemplary semiconductor structure of FIG. 6 after removing the first sacrificial gate structure straddling over a portion of the first fin stack to provide a first gate cavity.

Referring now to FIG. 7, there is illustrated the exemplary semiconductor structure of FIG. 6 after removing the first sacrificial gate structure 20L straddling over a portion of the first fin stack (14L, 16L) to provide a first gate cavity 32. The first sacrificial gate structure 20L may be removed utilizing an etch process (or etching processes) that is (are) selective in removing the at least one sacrificial material portion that provides the first sacrificial gate structure 20L. Prior to removing the first sacrificial gate structure 20L, a block mask can be formed protecting the second device region 102 that includes the second sacrificial gate structure 20R. After removing the first sacrificial gate structure 20L, the block mask mentioned above can be removed from the exemplary semiconductor structure so as to provide the structure shown in FIG. 7.

Figure 8:
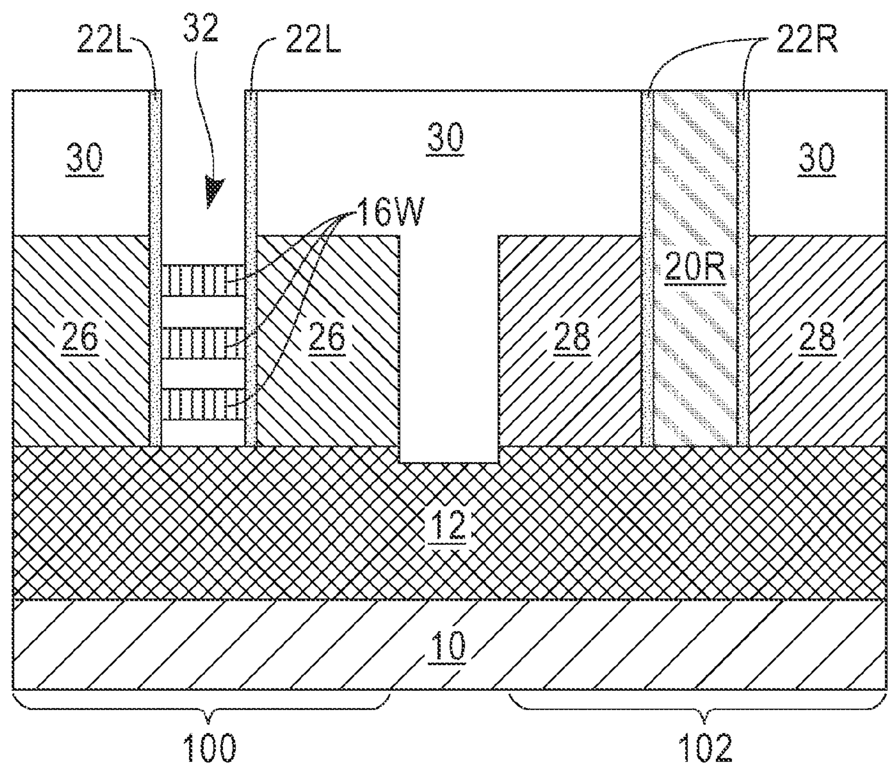
FIG. 8 is a cross sectional view in between the fins of the exemplary semiconductor structure of FIG. 7 after removing exposed portions of each III-V compound semiconductor material portion of the first fin stack within the first gate cavity to provide suspended germanium nanowires in the first device region.

Referring now to FIG. 8, there is illustrated the exemplary semiconductor structure of FIG. 7 after removing exposed portions of each III-V compound semiconductor material portion 14L of the first fin stack (14L, 16L) within the first gate cavity 32 to provide suspended germanium nanowires 16W in the first device region 100. Each suspended germanium nanowire 16W represents a portion of a germanium material portion 16L that is not protected by the first dielectric spacer 22L and the first source/drain structure 26. Each suspended germanium nanowire 16W has a topmost surface, a bottommost surface and two sidewall surfaces that are bare.

The exposed portions of each III-V compound semiconductor material portion 14L of the first fin stack (14L, 16L) within the first gate cavity 32 can be removed utilizing at least one etching process that is selective in removing the III-V compound semiconductor that provides each III-V compound semiconductor material portion 14L. In one embodiment of the present application and when each III-V compound semiconductor material portion 14L comprises GaAs, an aqueous HF echant can be used.

It is noted that portions of the first fin stack (14L, 16L) remain beneath the first source/drain structure 26. Thus, each end of each suspended nanowire germanium portion 16W in the first device region 100 is attached to a remaining portion of the germanium material portion 16L that is present beneath the first source/drain structure 26. The remaining portion of each germanium material portion 16L that is located beneath the first source/drain structure 26 has a bottommost surface that contacts a III-V compound semiconductor.

Figure 9:
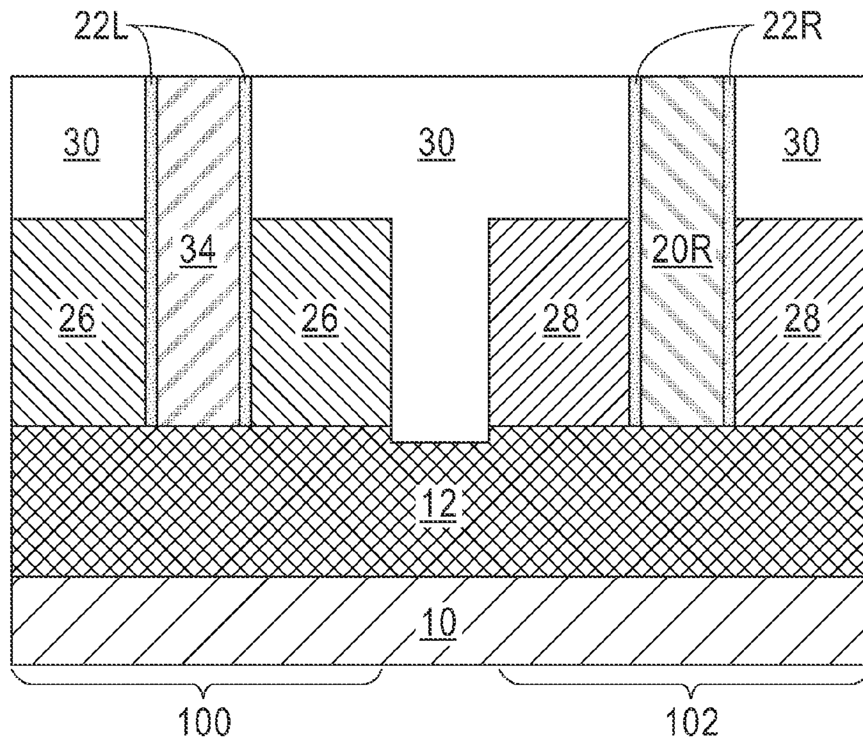
FIG. 9 is a cross sectional view in between the fins of the exemplary semiconductor structure of FIG. 8 after forming a first functional gate structure in the first gate cavity.

Referring now to FIG. 9, there is illustrated the exemplary semiconductor structure of FIG. 8 after forming a first functional gate structure 34 in the first gate cavity 32. The first functional gate structure 34 fills the entirety of the first gate cavity 32 and is present on each exposed surface of the suspended germanium nanowires 16W. A bottommost surface of the first functional gate structure 34 contacts a topmost surface of the germanium layer 12. Although a single first functional gate structure is described and illustrated, a plurality of first functional gate structures can be formed within various first gate cavities that may be present and surrounding each suspended germanium nanowire.

By "functional gate structure" it is meant a permanent gate structure used to control output current (i.e., flow of carriers in the channel) of a semiconducting device through electrical or magnetic fields. The first functional gate structure 34 that is formed includes a first gate dielectric (not shown) and a first gate conductor (not shown). In some embodiments, a first gate cap (not shown) can be present atop the first gate conductor. Notably, the first gate dielectric would be formed around each suspended germanium nanowire 16W and a portion of the first gate dielectric would be located on the topmost surface of the germanium layer 12. The first gate conductor would fill in the remaining volume of the first gate cavity and portions thereof would be located between each suspended germanium nanowire 16W. When a first gate cap is present an upper portion of the first gate conductor can be recessed below the topmost surface of the ILD material 30 and thereafter the first gate cap can be formed in the recessed region provided to the first gate conductor.

The first gate dielectric comprises a gate dielectric material. The gate dielectric material that provides the first gate dielectric can be an oxide, nitride, and/or oxynitride. In one example, the gate dielectric material that provides the first gate dielectric can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as the first gate dielectric.

The gate dielectric material used in providing the first gate dielectric can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material used in providing the first gate dielectric can have a thickness in a range from 1 nm to 10 nm. Other thicknesses that are lesser than, or greater than, the aforementioned thickness range can also be employed for the first gate dielectric.

The first gate conductor comprises a gate conductor material. The gate conductor material used in providing the first gate conductor can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, first gate conductor comprises a pFET gate metal.

The gate conductor material used in providing the first gate conductor can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition In one embodiment, the gate conductor material used in providing the first gate conductor has a thickness from 20 nm to 100 nm. Other thicknesses that are lesser than, or greater than, the aforementioned thickness range can also be employed for the gate conductor material used in providing the first gate conductor.

If present, the first gate cap comprises a gate cap material. The gate cap material that provides the first gate cap may include one of the dielectric materials mentioned above for hard mask material. In one embodiment, the first gate cap comprises silicon dioxide, silicon nitride, and/or silicon oxynitride. The dielectric material that provides the first gate cap can be formed utilizing a conventional deposition process such as, for example, chemical vapor deposition or plasma enhanced chemical vapor deposition. The dielectric material that provides the first gate cap can have a thickness from 5 nm to 20 nm. Other thicknesses that are lesser than, or greater than, the aforementioned thickness range can also be employed as the thickness of the dielectric material that provides the first gate cap.

Figure 10:
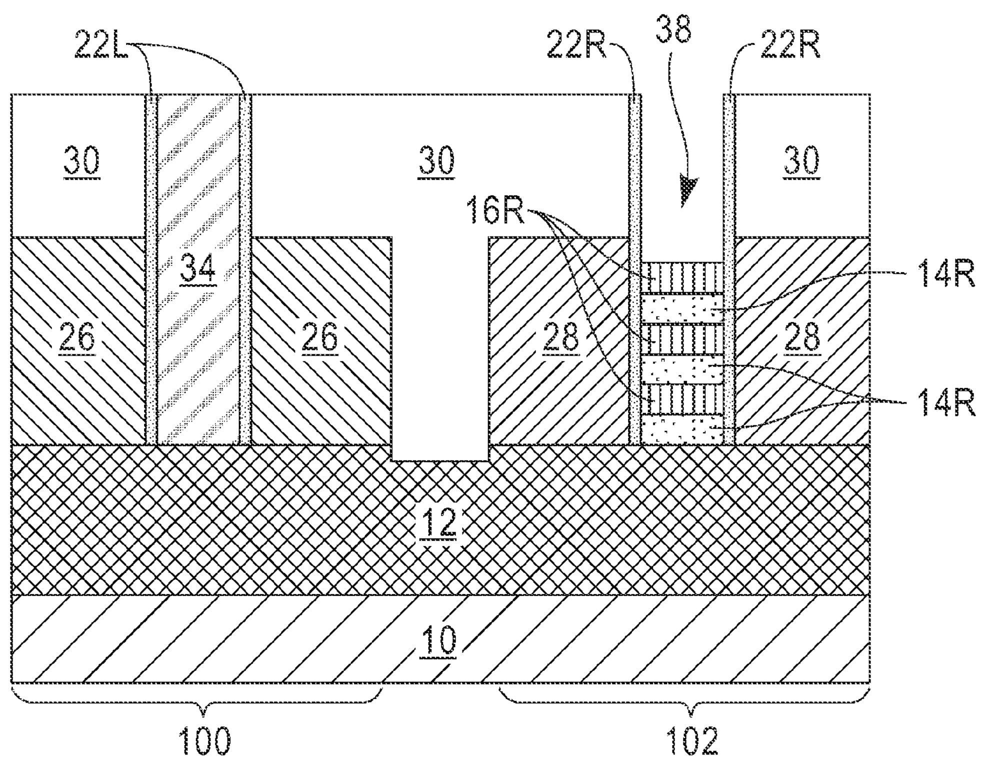
FIG. 10 is a cross sectional view in between the fins of the exemplary semiconductor structure of FIG. 9 after removing the second sacrificial gate structure straddling over a portion of the second fin stack to provide a second gate cavity.

Referring now to FIG. 10, there is illustrated the exemplary semiconductor structure of FIG. 9 after removing the second sacrificial gate structure 20R straddling over a portion of the second fin stack (14R, 16R) to provide a second gate cavity 38. The second sacrificial gate structure 20R may be removed utilizing an etch process (or etching processes) that is (are) selective in removing the at least one sacrificial material portion that provides the second sacrificial gate structure 20R. Prior to removing the second sacrificial gate structure 20R, a block mask can be formed protecting the first device region 100 that includes the first functional gate structure 34. After removing the second sacrificial gate structure 20R, the block mask mentioned above can be removed from the exemplary semiconductor structure so as to provide the structure shown in FIG. 10.

Figure 11:
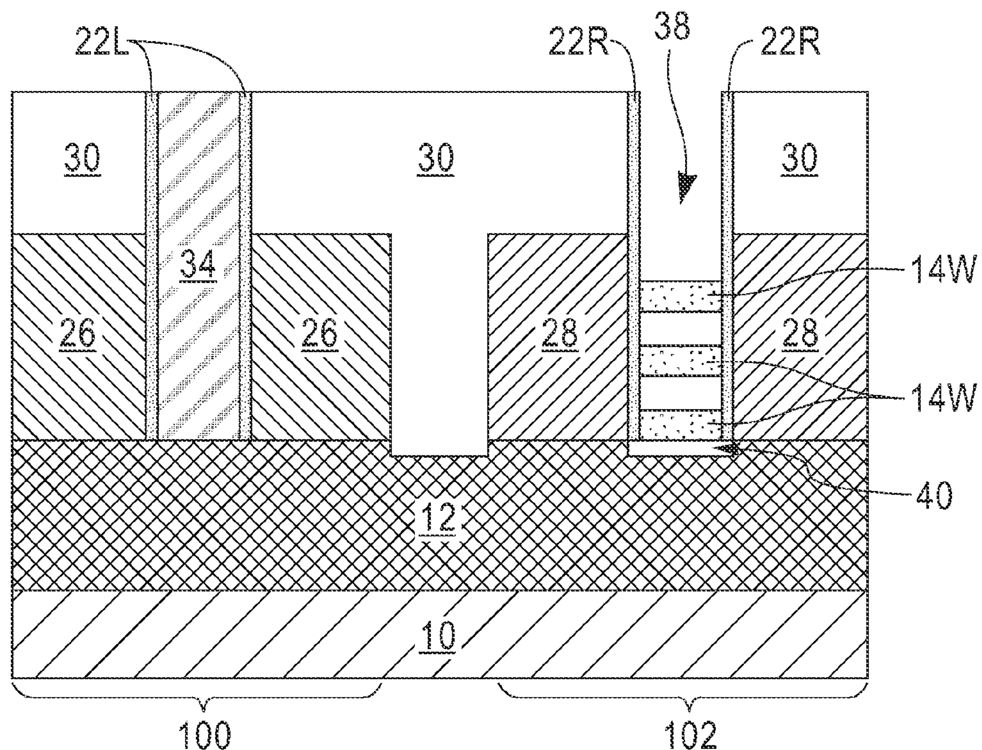
FIG. 11 is a cross sectional view in between the fins of the exemplary semiconductor structure of FIG. 10 after removing exposed portions of each germanium material portion of the second fin stack within the second gate cavity to provide suspended III-V compound semiconductor nanowires in the second device region.

Referring now to FIG. 11, there is illustrated the exemplary semiconductor structure of FIG. 10 after removing exposed portions of each germanium material portion 16R of the second fin stack within the second gate cavity 38 to provide suspended III-V compound semiconductor nanowires 14W in the second device region 102. Each suspended III-V compound semiconductor nanowire 14W represents a portion of a III-V compound semiconductor material portion 14R that is not protected by the second dielectric spacer 22R and the second source/drain structure 28. Each suspended III-V compound nanowire 14W has a topmost surface, a bottommost surface and two sidewall surfaces that are bare.

The exposed portions of each germanium material portion 16R of the second fin stack (14R, 16R) within the second gate cavity 38 can be removed utilizing at least one etching process that is selective in removing germanium; during this etch an upper portion of the germanium layer 12 is also etched providing a recessed region 40; the recessed region 40 may have a width that is greater than a width of the second gate cavity 38. In one embodiment of the present application, germanium can be etched utilizing hydrogen peroxide as an etchant.

It is noted that portions of the second fin stack (14R, 16R) remain beneath the second source/drain structure 28. Thus, each end of each suspended III-V compound semiconductor nanowire 14W in the second device region 102 is attached to a remaining portion of the III-V compound semiconductor material portion 14R that is present beneath the second source/drain structure 28. The remaining portion of each III-V compound semiconductor portion 14R that is located beneath the second source/drain structure 28 has a bottommost surface that contacts germanium.

Figure 12:
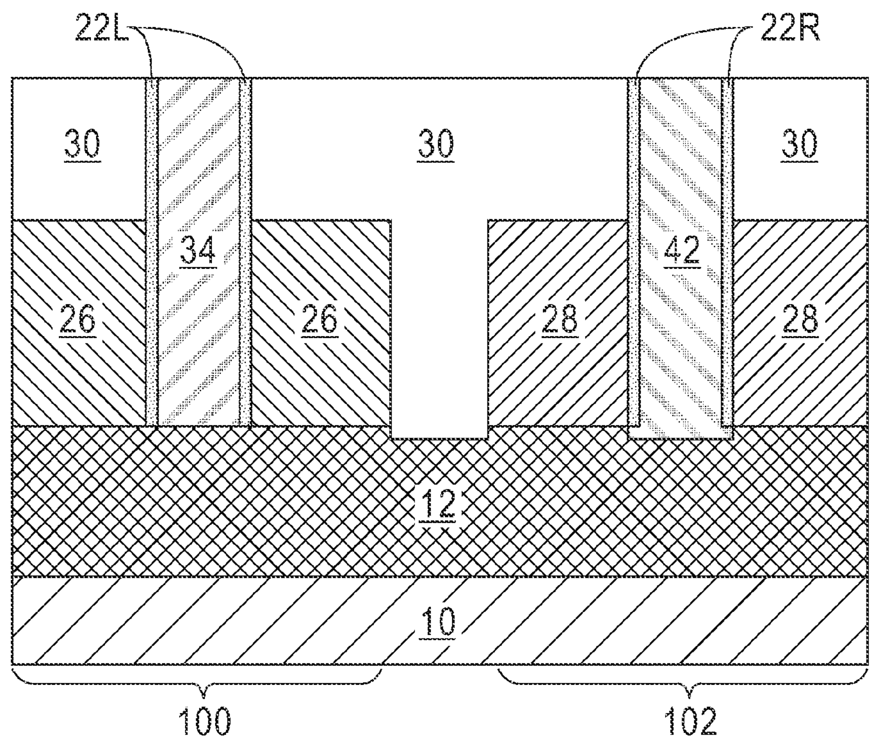
FIG. 12 is a cross sectional view in between the fins of the exemplary semiconductor structure of FIG. 11 after forming a second functional gate structure in the second gate cavity.

Referring now to FIG. 12, there is illustrated the exemplary semiconductor structure of FIG. 11 after forming a second functional gate structure 42 in the second gate cavity 38. A portion of the second functional gate structure 42 forms within the recessed region 40 mentioned above. The second functional gate structure 42 fills the entirety of the second gate cavity 38 and recessed region 40 and is present on each exposed surface of the suspended III-V compound semiconductor nanowires 14W. A bottommost surface of the second functional gate structure 42 contacts a recessed surface of the germanium layer 12. Although a single second functional gate structure is described and illustrated, a plurality of second functional gate structures can be formed within various second gate cavities that may be present and surrounding each suspended III-V compound semiconductor nanowire.

The second functional gate structure 42 that is formed includes a second gate dielectric (not shown) and a second gate conductor (not shown). In some embodiments, a second gate cap (not shown) can be present atop the second gate conductor. Notably, the second gate dielectric would be formed around each suspended III-V compound semiconductor nanowire 14W and a portion of the second gate dielectric would be located on the recessed surface of the germanium layer 12. The second gate conductor would fill in the remaining volume of the second gate cavity and portions thereof would be located between each suspended III-V compound semiconductor nanowire 14W. When a second gate cap is present an upper portion of the second gate conductor can be recessed below the topmost surface of the ILD material 30 and thereafter the second gate cap can be formed in the recessed region provided to the second gate conductor.

The second gate dielectric comprises one of the gate dielectric materials mentioned for the first gate dielectric. In some embodiments, the second gate dielectric comprises a same gate dielectric material as the first gate dielectric. In other embodiments, the second gate dielectric comprises a different gate dielectric material than that which provides the first gate dielectric. The second gate dielectric can be formed utilizing one of the techniques mentioned above in forming the first gate dielectric. The second gate dielectric has a thickness within the range mentioned above for the first gate dielectric.

The second gate conductor comprises one of the gate conductor materials mentioned for the first gate conductor. In some embodiments, the second gate conductor comprises a same gate conductor material as the first gate conductor. In other embodiments, the second gate conductor comprises a different gate conductor material than that which provides the first gate conductor. For example, the second gate conductor may comprise nFET gate metal, while the first gate conductor may comprise a pFET gate metal. The second gate conductor can be formed utilizing one of the techniques mentioned above in forming the first gate conductor. The second gate conductor has a thickness within the range mentioned above for the first gate conductor.

The second gate cap comprises one of the gate cap materials mentioned for the first gate cap. In some embodiments, the second gate cap comprises a same gate cap material as the first gate cap. In other embodiments, the second gate cap comprises a different gate cap material than that which provides the first gate cap. The second gate cap can be formed utilizing one of the techniques mentioned above in forming the first gate cap. The second gate cap has a thickness within the range mentioned above for the first gate cap.

It is noted that although the present application describes and illustrates the formation of the first functional gate structure 36 within the first device region 100 prior to formation of the second functional gate structure 42 in the second device region 102, the present application also works for embodiments in which the order of the formation of the first and second functional gate structures is reversed.

Also, and in some embodiments, the germanium layer 12 in FIG. 1 may be replaced with a III-V compound semiconductor material layer. In such an embodiment, the material stack shown in FIG. 2 would include alternating layers, and from bottom to top, of a germanium material and a III-V compound semiconductor material. Processing as described in FIGS. 3-12 can then be performed to form a structure similar to the one illustrated in FIG. 12. In such an embodiment, a recessed region would be formed in the device region in which suspended germanium nanowires are formed.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:

forming a first sacrificial gate structure straddling over a portion of a first fin stack and a second sacrificial gate structure straddling over a portion of a second fin stack, wherein said first and second fin stacks comprise alternating layers of a III-V compound semiconductor material portion and a germanium material portion;

forming a first source/drain structure on other portions of said first fin stack and adjacent said first sacrificial gate structure and a second source/drain structure on other portions of said second fin stack and adjacent said second sacrificial gate structure;

removing said first sacrificial structure selective to said second sacrificial gate structure to provide a first gate cavity;

removing each exposed III-V compound semiconductor portion of said first fin stack in said first gate cavity to provide suspended germanium nanowires that comprise a portion of each germanium material portion of said first fin stack;

forming a first functional gate structure in said first gate cavity and surrounding each suspended germanium nanowire;

removing said second sacrificial structure selective to said first functional gate structure to provide a second gate cavity;

removing each exposed germanium material portion of said second fin stack in said second gate cavity to provide suspended III-V compound semiconductor nanowires that comprise a portion of each III-V compound semiconductor material portion of said second fin stack; and forming a second functional gate structure in said second gate cavity and surrounding each suspended III-V compound semiconductor nanowire.

2. The method of claim 1, wherein said first fin stack is formed on a first portion of a germanium layer and said second fin stack is formed on a second portion of said germanium layer and wherein said first and second fin stacks comprise alternating layers, of from bottom to top, of said III-V compound semiconductor material portion and said germanium material portion.

3. The method of claim 2, wherein during said removing each exposed germanium material portion in said second device region, a recessed region is provided in said germanium layer, and wherein a lower portion of said second functional gate structure fills said recessed region.

4. The method of claim 1, wherein said first fin stack is formed on a first portion of a III-V compound semiconductor layer and said second fin stack is formed on a second portion of said III-V compound semiconductor layer and wherein said first and second fin stacks comprise alternating layers, of from bottom to top, of said germanium material portion and said III-V compound semiconductor material portion.

5. The method of claim 4, wherein during said removing each exposed III-V compound semiconductor portion in said first device region, a recessed region is provided in said III-V compound semiconductor layer, and wherein a lower portion of said first functional gate structure fills said recessed region.

6. The method of claim 1, wherein said first fin stack and said second fin stack are formed by:

providing a material stack comprising alternating layers of a III-V compound semiconductor material and a germanium material; and patterning said material stack.

7. The method of claim 6, wherein said providing said material stack comprises epitaxial deposition said alternating layers of said III-V compound semiconductor material and said germanium material.

8. The method of claim 6, wherein said patterning comprises a sidewall image transfer process.

9. The method of claim 1, further comprising forming a dielectric spacer on sidewall surfaces of said first sacrificial gate structure and said second sacrificial gate structure prior to forming said first and second source/drain structures.

10. The method of claim 1, wherein said first source/drain structure and said second source/drain structure are formed utilizing at least an epitaxial growth process.

11. A method of forming a semiconductor structure, said method comprising:

forming a first sacrificial gate structure straddling over a portion of a first fin stack and a second sacrificial gate structure straddling over a portion of a second fin stack, wherein said first and second fin stacks comprise alternating layers of a III-V compound semiconductor material portion and a germanium material portion;

forming a first source/drain structure on other portions of said first fin stack and adjacent said first sacrificial gate structure and a second source/drain structure on other portions of said second fin stack and adjacent said second sacrificial gate structure;

removing said second sacrificial structure selective to said first sacrificial gate structure to provide a second gate cavity;

removing each exposed germanium material portion of said second fin stack in said second gate cavity to provide suspended III-V compound semiconductor nanowires that comprise a portion of each III-V compound semiconductor material portion of said second fin stack;

forming a second functional gate structure in said second gate cavity and surrounding each suspended III-V compound semiconductor nanowire;

removing said first sacrificial structure selective to said second functional gate structure to provide a first gate cavity;

removing each exposed III-V compound semiconductor portion of said first fin stack in said first gate cavity to provide suspended germanium nanowires that comprise a portion of each germanium material portion of said first fin stack; and forming a first functional gate structure in said first gate cavity and surrounding each suspended germanium nanowire.

12. The method of claim 11, wherein said first fin stack is formed on a first portion of a germanium layer and said second fin stack is formed on a second portion of said germanium layer and wherein said first and second fin stacks comprise alternating layers, of from bottom to top, of said III-V compound semiconductor material portion and said germanium material portion.

13. The method of claim 12, wherein during said removing each exposed germanium material portion in said second device region, a recessed region is provided in said germanium layer, and wherein a lower portion of said second functional gate structure fills said recessed region.

14. The method of claim 11, wherein said first fin stack is formed on a first portion of a III-V compound semiconductor layer and said second fin stack is formed on a second portion of said III-V compound semiconductor layer and wherein said first and second fin stacks comprise alternating layers, of from bottom to top, of said germanium material portion and said III-V compound semiconductor material portion.

15. The method of claim 14, wherein during said removing each exposed III-V compound semiconductor portion in said first device region, a recessed region is provided in said III-V compound semiconductor layer, and wherein a lower portion of said first functional gate structure fills said recessed region.

16. The method of claim 11, wherein said first fin stack and said second fin stack are formed by providing a material stack comprising alternating layers of a III-V compound semiconductor material and a germanium material; and patterning said material stack.

17. The method of claim 16, wherein said providing said material stack comprises epitaxial deposition said alternating layers of said III-V compound semiconductor material and said germanium material.

18. The method of claim 16, wherein said patterning comprises a sidewall image transfer process.

19. The method of claim 11, further comprising forming a dielectric spacer on sidewall surfaces of said first sacrificial gate structure and said second sacrificial gate structure prior to forming said first and second source/drain structures.

20. The method of claim 11, wherein said first source/drain structure and said second source/drain structure are formed utilizing at least an epitaxial growth process.

* * * * *